(12) United States Patent
Luo et al.

(10) Patent No.: US 6,265,885 B1
(45) Date of Patent: Jul. 24, 2001

(54) METHOD, APPARATUS AND COMPUTER PROGRAM PRODUCT FOR IDENTIFYING ELECTROSTATIC DISCHARGE DAMAGE TO A THIN FILM DEVICE

(75) Inventors: Jih-Shiuan Luo, San Jose; Robert Langland Smith, Cupertino; Chin-Yu Yeh, San Jose, all of CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/389,138

(22) Filed: Sep. 2, 1999

(51) Int. Cl.⁷ .................................................. G01R 31/26
(52) U.S. Cl. ........................................ 324/719; 324/765
(58) Field of Search .................................. 324/719, 527, 324/456, 452, 765

(56) References Cited

U.S. PATENT DOCUMENTS

| | | | |
|---|---|---|---|
| 4,636,724 * | 1/1987 | Fukuda et al. ..................... | 324/527 |
| 4,823,088 * | 4/1989 | Fukuda .............................. | 324/456 |
| 5,083,117 * | 1/1992 | Hoigaard ........................... | 340/649 |
| 5,796,256 * | 8/1998 | Fowler et al. ..................... | 324/456 |
| 6,049,213 * | 4/2000 | Abadeer ............................ | 324/719 |

\* cited by examiner

*Primary Examiner*—Safet Metjahic
*Assistant Examiner*—T. R. Sundaram
(74) *Attorney, Agent, or Firm*—Robert B. Martin; Bracewell & Patterson, L.L.P.

(57) ABSTRACT

A method, apparatus and computer program product for identifying electrostatic discharge (ESD) damage to a thin film device. The method includes (1) determining a cold resistance of the thin film device, (2) determining a hot resistance of the thin film device, (3) calculating a heating delta resistance (HDR) from the hot and cold resistances and (4) comparing the HDR to a threshold value to ascertain if the thin film device has suffered ESD damage. The HDR of the thin film device is characterized by the following relationship: HDR=(hot resistance-cold resistance)/(cold resistance).

24 Claims, 2 Drawing Sheets

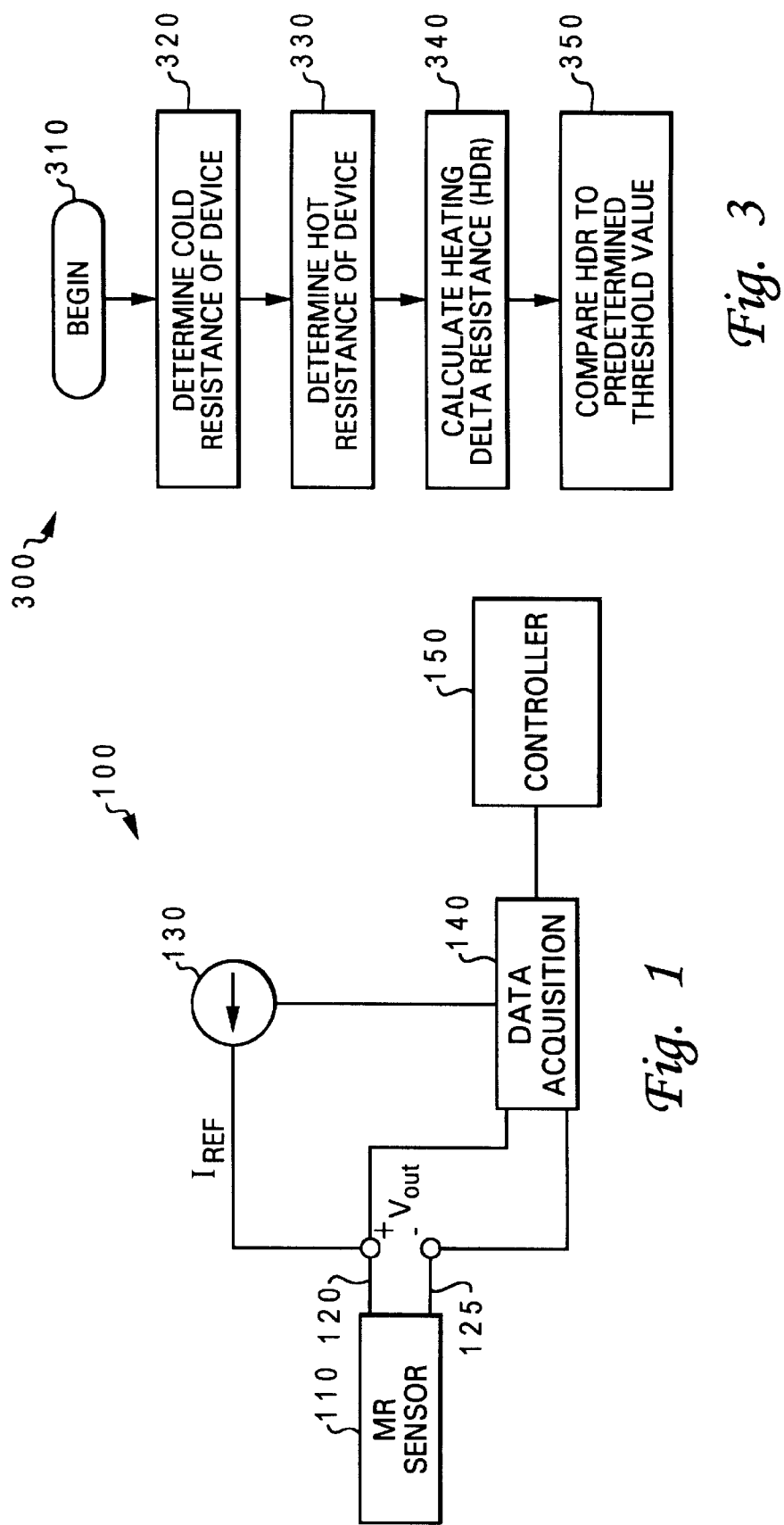

METHOD, APPARATUS AND COMPUTER PROGRAM PRODUCT FOR IDENTIFYING ELECTROSTATIC DISCHARGE DAMAGE TO A THIN FILM DEVICE

BACKGROUND OF THE INVENTION

1. Technical Field of the Invention

The present invention relates in general to thin film devices and more specifically to a method, apparatus and computer program product for identifying electrostatic discharge (ESD) damage to a thin film device.

2. Description of the Related Art

Magnetic head disk drive systems are widely employed in the computer industry as a cost effective form of data storage. In a magnetic disk drive system, a magnetic recording medium, in the form of a disk, rotates at a high speed while a magnetic read/write transducer, generally referred to as a magnetic head, elevates slightly above the surface of the rotating disk. The magnetic head is attached to or formed integrally with a "slider" that is suspended over the disk on a spring-loaded support arm known as an actuator arm. As the magnetic disk is rotated at its operating speed, moving air generated by the rotating disk in conjunction with the physical design of the slider operate to lift the magnetic head allowing it to glide or elevate slightly above and over the disk surface on a cushion of air, generally referred to as an air bearing. The height at which the magnetic head elevates over the disk surface is typically only a few microinches or less and is primarily a function of the disk's rotation, the aerodynamic properties of the slider assembly and the force exerted by the spring-loaded arm.

The magnetic head typically includes a magnetoresistive (MR) transducer or sensor element electrically connected to detection circuitry. MR sensors are well known in the art and are particularly useful as read elements in magnetic transducers, especially at high data recording densities. The MR sensor generally has a resistance that modulates in response to changing magnetic fields corresponding to magnetically encoded information. The detection circuitry detects the resulting changes in resistance by passing a sense current through the MR sensor and measuring the voltage drop across the MR sensor. The detected voltage signal is then used to recover information from the magnetic disk. The MR read sensor provides a higher output signal than an inductive read head. This higher output signal results in a higher signal to noise ratio for the recording channel and consequently permits higher area density of recorded data on a magnetic disk surface.

A major problem encountered during the manufacturing and assembly of magnetic heads is the buildup of electrostatic charges on the various elements of a magnetic head or other objects that come into contact with the magnetic head and the accompanying spurious discharges of static energy generated. For example, static charges may be generated by the presence of certain materials, such as plastics, during the manufacture and subsequent handling of the magnetic heads. These charges can induce or result in electrostatic discharge. The net effect of such a discharge often damages or degrades the MR sensor in reading data correctly.

Currently, the ESD screening regimes employed in the manufacture of MR sensors are typically of two general types. One approach is to employ a sampling method wherein a number of randomly chosen MR sensors are selected and undergo a detail inspection. This approach, however, may not catch all the sensors that may have suffered ESD damage. Another method is to take a first measurement of the resistance of every sensor prior to final fabrication and a second subsequent resistance measurement of all the sensors after final fabrication. The two resistance measurements are then compared with each other to identify potential ESD damage. This method, however, requires two measurements that increase the time required to fabricate a sensor.

SUMMARY OF THE INVENTION

It is therefore an object of the present invention to provide a method, apparatus and computer program product for identifying electrostatic discharge (ESD) damage to a thin film device.

To achieve the foregoing object, and in accordance with the invention as embodied and broadly described herein, a method, apparatus and computer program product for identifying electrostatic damage to a thin film device is disclosed. The method includes (1) determining a cold resistance of the thin film device, (2) determining a hot resistance of the thin film device, (3) calculating a heating delta resistance (HDR) from the hot and cold resistances and (4) comparing the HDR to a threshold value to ascertain if the thin film device has suffered ESD damage. The HDR of the thin film device is characterized by the following relationship:

HDR=(hot resistance-cold resistance)/(cold resistance).

The present invention recognizes that there is a noticeable difference between the resulting heating delta resistance (HDR) value of a thin film device, such as MR sensor, that has suffered ESD damage from the HDR value of an undamaged device. The present invention utilizes this identified difference between the HDR values of a damaged and unaffected device to provide a more efficient and time effective screening mechanism that may be advantageously employed in, but not limited to, the manufacturing and fabrication processes of thin film devices.

In one embodiment of the present invention, the thin film device is a magnetoresistive (MR) sensor. In a related embodiment, the MR sensor is a ansitropic magnetoresistive (AMR) sensor. Alternatively, the MR sensor may be a giant magnetoresistive (GMR) sensor.

In yet another embodiment of the present invention, determining the hot resistance value of the MR sensor includes applying an operational current of the MR sensor. In an embodiment to be described in greater detail herein, the operational current ranges from about 4 milliamps to about 10 milliamps. In another related embodiment, on the other hand, determining the cold resistance of the MR sensor includes applying a current of less than 1 milliamp.

The foregoing description has outlined, rather broadly, preferred and alternative features of the present invention so that those skilled in the art may better understand the detailed description of the invention that follows. Additional features of the invention will be described hereinafter that form the subject matter of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which:

FIG. 1 illustrates a block diagram of an embodiment of a testing environment constructed according to the principles disclosed by the present invention;

FIG. 3 illustrates a high-level process flow of an embodiment of an ESD screening process employing the principles disclosed by the present invention.

DETAILED DESCRIPTION

Figure 2A:
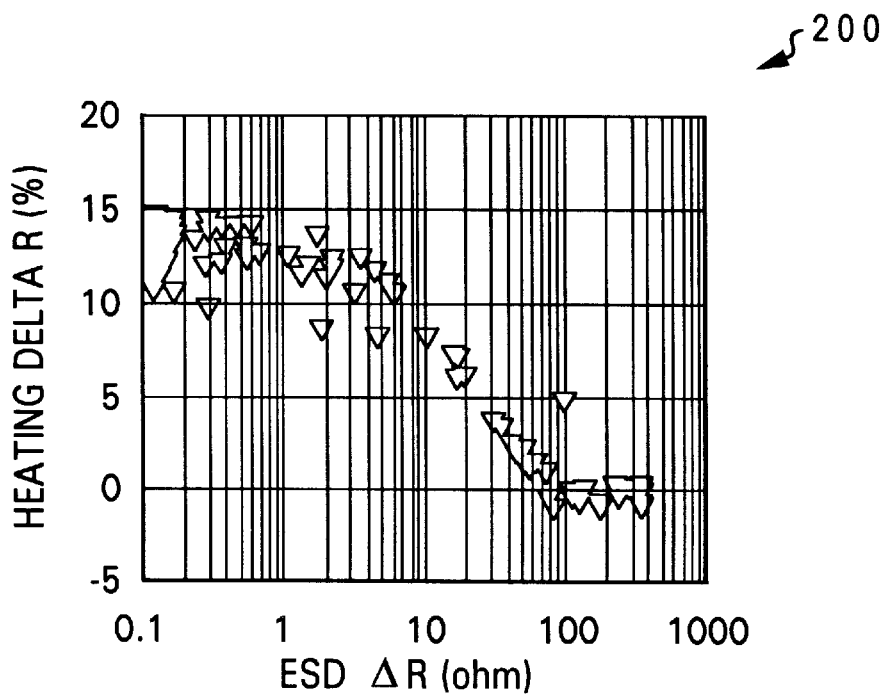
FIG. 2A illustrates an exemplary graph of calculated HDR measurements for a plurality of AMR sensors that have been subjected to a simulated ESD versus ESD ΔR.

With reference now to the figures, and in particular, with reference to FIG. 1, there is depicted a block diagram 100 of an embodiment of a testing environment constructed according to the principles disclosed by the present invention. In the illustrated embodiment, a magnetoresistive (MR) sensor 110, e.g., a thin film device, is shown coupled to a conventional current generator 130 and a data acquisition device 140 via first and second electrical conductors 120, 125, respectively. First and second electrical conductors are typically part of MR sensor 110. Data acquisition device 140 is also shown coupled to current generator 130 and a controller 150. In an advantageous embodiment, data acquisition device 140 is an analog to digital (A/D) circuit card that is resident in controller 150. Data acquisition device 140 is used to control the current output of current generator 130 and to measure the voltage Vout across first and second electrical conductors 120, 125. It should be readily apparent to those skilled in the art that current generator 130, data acquisition device 140 and controller 150 may also be embodied in an automatic testing equipment (ATE) such as a Hewlett-Packard HP4145B Semiconductor Parameter Analyzer.

Controller 150, in an advantageous embodiment, is an IBM™ PC computer manufactured by IBM Corporation of Armonk, N.Y. It should also be readily apparent to those skilled in the art, however, that alternative computer system architectures may be employed. Generally, controller 150, embodied in a PC computer, comprises a bus for communicating information, a processor coupled to the bus for processing information, a random access memory coupled to the bus for storing information and instructions for the processor, a read-only memory coupled to the bus for storing static information and instructions for the processor, a display device coupled to the bus for displaying information for a computer user, an input device coupled to the bus for communicating information and command selections to the processor and a data storage device, such as a magnetic disk and associated disk drive, coupled to the bus for storing information and instructions.

The processor may be any of a wide variety of general purpose processors or microprocessors, such as the i486™ or Pentium™ brand microprocessor manufactured by Intel Corporation of Santa Clara, Calif. However, it should be apparent to those skilled in the art that other varieties of processors may be utilized in a computer system. The display device may be a liquid crystal device, cathode ray tube (CRT), or other suitable display device. The data storage device may be a conventional hard disk drive, floppy disk drive, or other magnetic or optical data storage device for reading and writing information stored on a hard disk drive, floppy disk drive, or other magnetic or optical data storage medium.

In general, the processor retrieves processing instructions and data from a data storage medium using the data storage device and downloads this information into random access memory for execution. Thereafter, the processor then executes an instruction stream from random access memory or read only memory. Command selections and information input at the input device are used to direct the flow of instructions executed by the processor. The results of this processing execution are then displayed on the display device.

MR sensor 110 generally comprises a sensing element (not shown) composed of a ferromagnetic material that is enclosed by a shield made of a highly permeable magnetic material such as Permalloy or Sendust. The shield minimizes the magnetic interferences from affecting the sensing element and thereby producing extraneous electrical pulses. Conductive leads, i.e., first and second electrical conductors 120, 125, attach electrically at the end portions of the sensing element to provide a means for measuring the resistance of the sensing element.

As discussed previously, static electrical charges build up on the various components of the sensor assembly or on any object, equipment or person that may come into contact with the sensor. These charges are generated during the fabrication process and poses serious potential damage to the sensor. The electrical charges migrate from the areas at which they are generated to build up along conductive paths. The buildup of static charges subsequently discharge from one conductive element across a dielectric, which experiences "breakdown," to another conductive element, in the manner of a capacitive discharge. The discharge typically causes damage by burnout or the like at the areas of the conductive material that function as terminals for the discharge of the stored static electrical energy.

The present invention recognizes that there is a noticeable difference between the resulting heating delta resistance (HDR) value of a thin film device, such as MR sensor 110, that has suffered ESD damage from the HDR value of an undamaged device. The present invention utilizes this identified disparity between the HDR values of a damaged and unaffected device to provide a more efficient and time effective screening mechanism that may be advantageously employed in, but not limited to, the manufacturing and fabrication processes of thin film devices. The HDR is defined by the following relationship:

HDR=(hot resistance-cold resistance)/(cold resistance), where the hot resistance is the resistance of the MR sensor 110 when an operational current is applied to it. The cold resistance is the resistance of MR sensor 110 when a minimum current (typically 1 mA or less) is applied, i.e., no or nearly no Joule heating is generated during the measurement process.

The values of the operational and minimum currents are dependent on the type of MR sensor and materials used to construct the sensor. In the illustrated embodiment, MR sensor 110 is a ansitropic magnetoresistive (AMR) sensor. Alternatively, in another embodiment, MR sensor 110 is a giant magnetoresistive (GMR) sensor. With both AMR and GMR type sensors, the operational current is typically four to ten milliamps. Similarly, with both AMR and GMR sensors, the minimum current utilized for the cold resistance measurement is generally less than one milliamp.

The differences in the resistance values of the hot and cold resistances is a result of Joule heating within the sensor which is dependent on the heat capacitance of the sensor and the heat conductance of the materials surrounding the sensor; the HDR is a characteristic property of the sensor. The relationship between the HDR of a sensor and ESD damage incurred by the sensor is described hereinafter in greater detail with reference to FIGS. 2A and 2B.

Figure 2B:
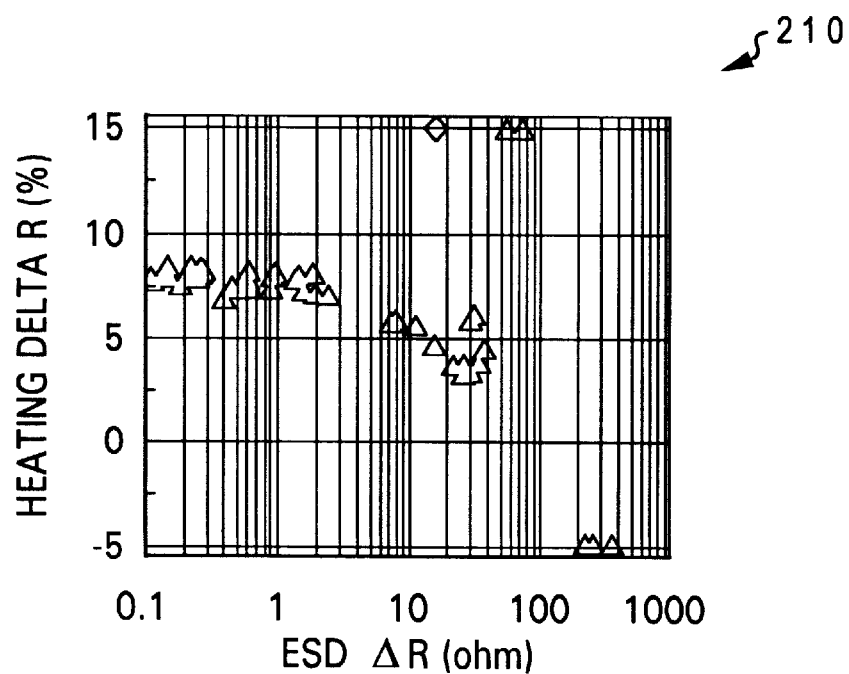
FIG. 2B illustrates an exemplary graph of calculated HDR measurements for a plurality of GMR sensors that have been subjected to a simulated ESD versus ESD ΔR.

Referring now to FIGS. 2A and 2B, there are illustrated exemplary graphs illustrating the HDRs of AMR and GMR sensors following the application of simulated ESD transients across the sensors. In particular, FIG. 2A depicts an exemplary graph 200 of calculated HDR measurements for a plurality of AMR sensors that have been subjected to a simulated ESD versus change in resistance ESD ΔR (where ESD ΔR is defined as R post ESD initiation—R pre ESD initiation). FIG. 2B depicts an exemplary graph 210 of calculated HDR measurements for a plurality of GMR sensors that have been subjected to a simulated ESD versus ESD ΔR. An ESD event is initiated by applying a 150 nanosecond exponential decay current pulse, i.e., Human Body Model (HBM) transient, across the MR sensor to simulate an ESD transient.

As illustrated in FIG. 2A, for the AMR sensors that have been damaged by the HBM transient, their calculated HDR values have decreased along with experiencing an increase in their overall resistance value. An AMR sensor that has encountered ESD damage typically suffers an increase in its resistance. For severely damaged AMR sensors, their HDR value is reduced to zero.

For the GMR sensors that have suffered damage due to ESD, as depicted in FIG. 2B, HDR decreases for those sensors that have a resistance increase of less than forty ohms. The HDR of a ESD damaged GMR sensor could be significantly higher than its initial HDR value or have a negative value if its resistance increase as a result of ESD damage is greater than forty ohms.

Referring now to FIG. 3, with continuing reference to FIG. 1, there is depicted a high-level process flow 300 of an embodiment of an ESD screening process employing the principles disclosed by the present invention. Process 300 is initiated, as depicted in step 310, when the screening process is queued for execution. Next, as illustrated in step 320, the cold resistance of MR sensor 110 is determined. This is accomplished by generating a reference current Iref, using current generator 130, to simulate a minimum current of MR sensor 110. In the illustrated embodiment of FIG. 1, controller 150 is executing an application program that instructs current generator 130, through data acquisition device 140, to initiate a current flow at a predetermined level and for a predetermined time. The minimum current is typically less than one milliamp. The value of the minimum current applied and the application period is dependent on the type of MR sensor under test and materials used to fabricate the MR sensor. Concurrent with the application of the minimum current, the voltage Vout across first and second electrical conductors 120, 125 is measured by data acquisition device 140 that, in turn, provides voltage Vout to controller 150. Controller 150 calculates the cold resistance of MR sensor 110, as is well known in the art, by dividing voltage Vout by reference current Iref.

Following the determination of the cold resistance of MR sensor 110, the hot resistance of the MR sensor 110 is determined as depicted in step 330. The determination of the hot resistance value is analogous to the manner in which the cold resistance was determined. In the case of the hot resistance, current generator 130 supplies a reference current Iref at an operational level, generally four to ten milliamps for a period of less than one second. Again, controller 150 calculates the hot resistance value of MR sensor 110 by dividing the measured voltage Vout by reference current Iref. It should be noted that although obtaining the cold resistance value prior to obtaining the hot resistance value is the preferred sequence, as shown in the illustrated embodiment, the alternative sequence of first determining the hot resistance value prior to determining the cold resistance value may also be advantageously employed.

After obtaining both the hot and cold resistance values of MR sensor 110, as illustrated in step 340, the heating delta resistance (HDR) of MR sensor 110 is calculated. Using the previously determined hot and cold resistances, controller 150 calculates the HDR using the following relationship:

HDR=(hot resistance-cold resistance)/(cold resistance).

With the calculated HDR, controller 150 next, as depicted in step 350, compares a predetermined threshold value with the HDR of MR sensor 110 to ascertain if MR sensor 110 has suffered ESD damage. The predetermined threshold value is calculated using the same process described above using a "good" or undamaged MR sensor to establish a baseline value. In other advantageous embodiments, the threshold value may be a constant value or, alternatively, a function of certain measured parameters of a batch of sensors, wafer or neighbouring heads on a wafer. The parameters, e.g., may be the stripe height, resistance or signal amplitude of the MR sensor. It should also be noted that the threshold value varies depending on the type of MR sensor under evaluation and type of materials employed to fabricate the MR sensor. Furthermore, the level of deviation of the HDR value of a MR sensor under test from the baseline HDR value used to screen a "failed" MR sensor is also dependent on the level of screening desired. For example, a more rigorous quality control standard may be implemented wherein MR sensors with HDR deviations larger than 2% are rejected. Typically, a baseline between 5 to 15% is employed. It should be noted that the baseline values utilized is very much design dependent.

It should noted that although the present invention has been described in the context of a computer system, those skilled in the art will readily appreciate that the present invention is also capable of being distributed as a computer program product in a variety of forms; the present invention does not contemplate limiting its practice to any particular type of signal-bearing media, i.e., computer readable medium, utilized to actually carry out the distribution. Examples of signal-bearing media includes recordable type media, such as floppy disks and hard disk drives, and transmission type media such as digital and analog communication links.

In a preferred embodiment, the present invention is implemented in a computer system programmed to execute the method described herein. Accordingly, in an advantageous embodiment, sets of instructions for executing the method disclosed herein are resident in RAM of one or more of computer systems configured generally as described hereinabove. Until required by the computer system, the set of instructions may be stored as computer program product in another computer memory, e.g., a disk drive. In another advantageous embodiment, the computer program product may also be stored at another computer and transmitted to a user's computer system by an internal or external communication network, e.g., LAN or WAN, respectively.

The present invention may be embodied in other specific forms without departing from its spirit or essential characteristics. The described embodiments are to be considered in all respects as illustrative and not restrictive. The scope of the invention is, therefore, indicated by the appended claims rather than by the foregoing description. All changes which come within the meaning and range of equivalency of the claims are to be embraced within their scope.

What is claimed is:

1. A method for identifying electrostatic discharge (ESD) damage to a thin film device, comprising the steps of:
   determining a cold resistance of said thin film device;
   determining a hot resistance of said thin film device;
   calculating a heating delta resistance (HDR) from said hot and cold resistances; and
   comparing said HDR to a threshold value to ascertain if said thin film device has suffered ESD damage.

2. The method as recited in claim 1 wherein said HDR is characterized by the following relationship:
   HDR=(hot resistance-cold resistance)/(cold resistance).

3. The method as recited in claim 1 wherein said thin film device is a magnetoresistive (MR) sensor.

4. The method as recited in claim 3 wherein said MR sensor is a ansitropic magnetoresistive (AMR) sensor.

5. The method as recited in claim 3 wherein said MR sensor is a giant magnetoresistive (GMR) sensor.

6. The method as recited in claim 3 wherein said step of determining a hot resistance includes applying an operational current of said MR sensor.

7. The method as recited in claim 6 wherein said operational current ranges from about 4 milliamps to about 10 milliamps.

8. The method as recited in claim 3 wherein said step of determining a cold resistance includes applying a current of less than 1 milliamp.

9. A computer program product comprising:
   a computer-readable medium having stored thereon computer executable instructions for implementing a method for identifying electrostatic discharge (ESD) damage to a thin film device, said computer executable instructions when executed, perform the steps of:
   determining a cold resistance of said thin film device;
   determining a hot resistance of said thin film device;
   calculating a heating delta resistance (HDR) from said hot and cold resistances; and
   comparing said HDR to a threshold value to ascertain if said thin film device has suffered ESD damage.

10. The computer program product as recited in claim 9 wherein said HDR is characterized by the following relationship:
    HDR=(hot resistance-cold resistance)/(cold resistance).

11. The computer program product as recited in claim 9 wherein said thin film device is a magnetoresistive (MR) sensor.

12. The computer program product as recited in claim 11 wherein said MR sensor is a ansitropic magnetoresistive (AMR) sensor.

13. The computer program product as recited in claim 11 wherein said MR sensor is a giant magnetoresistive (GMR) sensor.

14. The computer program product as recited in claim 11 wherein said step of determining a hot resistance includes applying an operational current of said MR sensor.

15. The computer program product as recited in claim 14 wherein said operational current ranges from about 4 milliamps to about 10 milliamps.

16. The computer program product as recited in claim 11 wherein said step of determining a cold resistance includes applying a current of less than 1 milliamp.

17. An apparatus for identifying electrostatic discharge (ESD) damage to a thin film device, comprising:
    means for determining a cold resistance of said thin film device;
    means for determining a hot resistance of said thin film device;
    means for calculating a heating delta resistance (HDR) from said hot and cold resistances; and
    means for comparing said HDR to a threshold value to ascertain if said thin film device has suffered ESD damage.

18. The apparatus as recited in claim 17 wherein said HDR is characterized by the following relationship:
    HDR=(hot resistance-cold resistance)/(cold resistance).

19. The method as recited in claim 17 wherein said thin film device is a magnetoresistive (MR) sensor.

20. The apparatus as recited in claim 19 wherein said MR sensor is a ansitropic magnetoresistive (AMR) sensor.

21. The apparatus as recited in claim 19 wherein said MR sensor is a giant magnetoresistive (GMR) sensor.

22. The apparatus as recited in claim 19 wherein said means for determining a hot resistance includes means for applying an operational current of said MR sensor.

23. The apparatus as recited in claim 22 wherein said operational current ranges from about 4 milliamps to about 10 milliamps.

24. The apparatus as recited in 19 where in said means for determining a cold resistance includes means for applying a current of less than 1 milliamp.

* * * * *